United States Patent [19]

Saito

[11] 4,164,004
[45] Aug. 7, 1979

[54] ELECTROCHEMICAL POTENTIAL MEMORY DEVICE USING LIQUID ELECTROLYTE

[75] Inventor: Satoshi Saito, Kyoto, Japan

[73] Assignee: Japan Storage Battery Company Limited, Kyoto, Japan

[21] Appl. No.: 812,302

[22] Filed: Jul. 1, 1977

[51] Int. Cl.$^2$ .............................................. H01G 9/00
[52] U.S. Cl. ..................................... 361/433; 324/94; 324/182
[58] Field of Search ................... 361/433; 324/182, 94; 252/62.2

[56] References Cited

U.S. PATENT DOCUMENTS 3,855,506  12/1974  Halasz et al. .................... 361/433

OTHER PUBLICATIONS

T. Takahashi et al., "Solid–State Ionics–Mixed Ionic and Electronic Conduction in $Ag_2Se$–$Ag_3PO_4$ Solid Solutions", J. Electrochem. Soc., vol. 119, No. 12, Dec. 1972, pp. 1735–1740.

T. Takahashi et al., "Solid–State Ionics . . .", J. Electrochem. Soc., vol. 118, No. 7, Jul. 1971, pp. 1051–1057.

Primary Examiner—James W. Davie
Attorney, Agent, or Firm—Sughrue, Rothwell, Mion, Zinn and Macpeak

[57] ABSTRACT

An electrochemical potential memory device comprising two electrodes containing an $Ag_2Se$–$Ag_3PO_4$ solid solution, and an aqueous or non-aqueous electrolyte containing $Ag^+$ ion.

16 Claims, 14 Drawing Figures

ELECTROCHEMICAL POTENTIAL MEMORY DEVICE USING LIQUID ELECTROLYTE

BACKGROUND OF THE INVENTION

1. Field of the Invention

This invention relates to an electrochemicl potential memory device formed of two electrodes containing an $Ag_2Se-Ag_3PO_4$ solid solution, and an aqueous or nonaqueous electrolyte containing silver ion.

2. Description of the Prior Art

Investigations on $Ag|RbAg_4I_5|\beta-Ag_2Se$ type cells have shown that cells of this type can be used as coulometers or memory devices as disclosed in Takahashi et al, [*J. Electrochem. Soc.*, 118, 1051 (1971)]. Detailed study of the electrochemical properties of an $Ag_2Se-Ag_3PO_4$ solid solution have been made as disclosed in Takahashi et al [*J. Electrochem. Soc.*, 119, 1735 (1972)], it has been shown that $Ag|RbAg_4I_5|Ag_2Se-Ag_3PO_4|RbAg_4I_5|Ag$ cells using this solid solution and a solid electrolyte can be used as analog memory devices. In this type of cell, one of the two Ag electrodes acts as a reference electrode.

An electrochemical memory device (Memoriode, trade name produced by Sanyo Electric) based on the application of this theory has been developed as disclosed in Ikeda et al [*Sanyo Technical Review*, 4, 3 (1972)], and the application of such a memory device to a timing apparatus is disclosed in U.S. Pat. No. 3,753,110.

In conventional electrochemical devices using an $Ag_2Se-Ag_3PO_4$ solid solution, a silver electrode is used as a counter electrode and a solid electrolyte is used as an electrolyte. In this type of electrochemical device, when a current is passed between the $Ag_2Se-Ag_3PO_4$ solid solution electrode and the silver electrode, and the voltage is simultaneously measured, an accurate value of the voltage cannot be obtained because of the resistance of the solid electrolyte or the polarization of the electrodes. In order to remove this defect, a reference electrode is employed. A current is passed between the $Ag_2Se-Ag_3PO_4$ solid solution electrode and the silver electrode, and the voltage is measured between the $Ag_2Se-Ag_3PO_4$ solid solution electrode and the reference electrode. These electrochemical potential memory devices have the following defects.

(1) In use, the electric circuit is complicated because three electrodes are involved.

(2) The relationship between the voltage and the quantity of electricity in the electrochemical device is not linear.

(3) The resistance is high because a solid electrolyte is used. Even if a reference electrode is employed, a large error in measurement occurs when a large current is passed.

(4) The operable voltage range is limited to that which is positive with respect to the reference electrode.

SUMMARY OF THE INVENTION

An object of the present invention is to provide an electrochemical potential memory device in which these defects of conventional electrochemical devices are eliminated.

An object of this invention is to provide an electrochemical potential memory device in which a change in the potential between the two electrodes takes place when a current is passed between them, the relationship between the quantity of electricity passed and the potential is substantially linear and is reproducibile within a certain potential range, the potential between the two electrodes is retained very well when a current is not passed between them, and in which there is no change in characteristics even when charging and discharging are repeated any desired number of times.

Thus, the present invention achieves the above objects and provides an electrochemical potential memory device comprising (a) two electrodes each containing an $Ag_2Se-Ag_3PO_4$ solid solution, and (b) an aqueous or nonaqueous electrolyte containing silver ion in which the weight of the $Ag_2Se-Ag_3PO_4$ solid solution present in one of the two electrodes is the same as that in the other of the two electrodes and in which the part of each electrode other than the $Ag_2Se-Ag_3PO_4$ solid solution, such as terminals, comprises a material having a standard single electrode potential more positive than that of silver or a material whose surface is coated with a material having a standard single electrode potential more positive than that of silver.

DETAILED DESCRIPTION OF THE INVENTION

The fundamental properties of a $Ag_2Se-Ag_3PO_4$ solid solution are described in detail below.

A cell of the following construction and specifications was built, and the fundamental electrochemical characteristics of the $Ag_2Se-Ag_3PO_4$ solid solution were examined.

Figure 1:
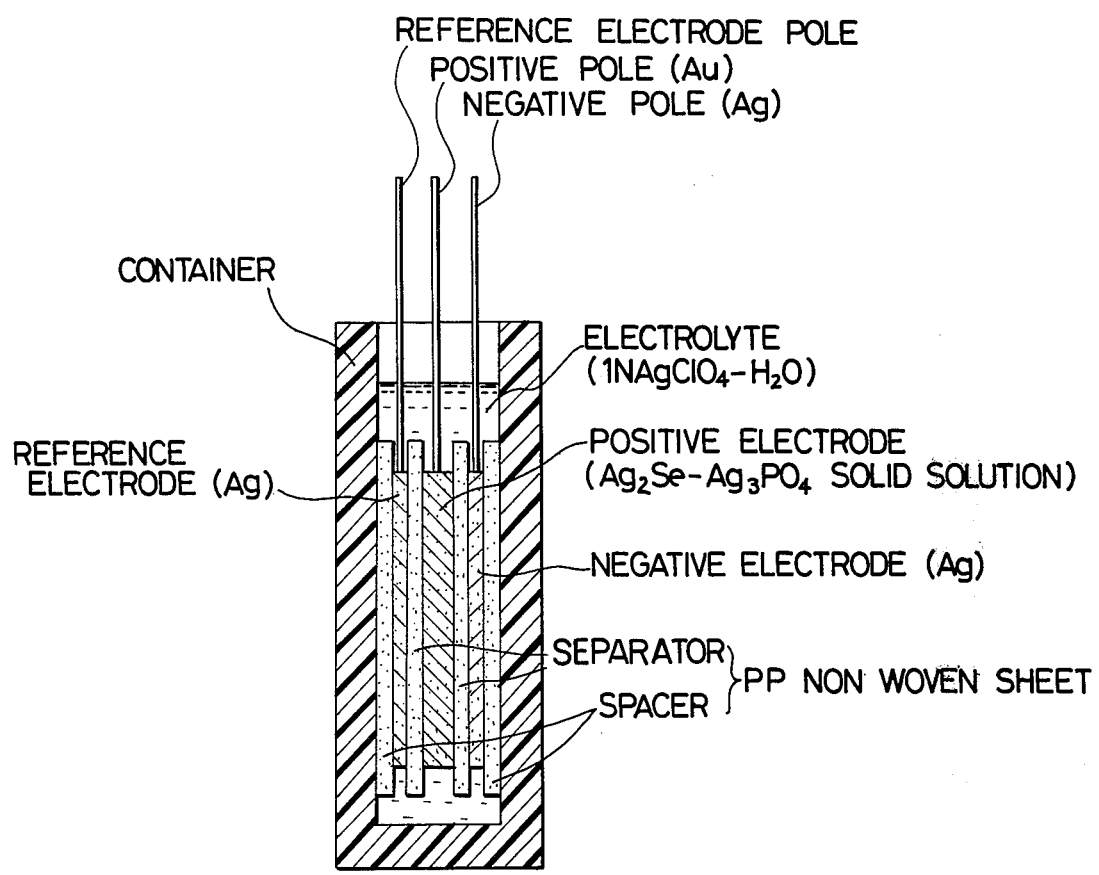
FIG. 1 is a sectional view of a cell for measuring the basic electrochemical properties of an $Ag_2Se-Ag_3PO_4$ solid solution.

Positive electrode: $Ag_2Se-Ag_3PO_4$ solid solution (380 mg) of $Ag_2Se$ (92.5 mole%)+$Ag_3PO_4$ (7.5 mole%); size: 10 mm×5 mm; thickness: 1 mm; lead wires: gold wires Negative electrode: silver plate; size: 10 mm×5 mm; thickness: 0.2 mm; lead wires: silver wires Reference electrode: same as the negative electrode described above Separator: polypropylene non-woven sheet Electrolyte: 1N aqueous solution of $AgClO_4$, 3 cc/cell The sectional view of this cell is shown in FIG. 1. A current was passed between the positive and negative electrodes, and the potential was measured between the positive electrode and the reference electrode.

Figure 2:
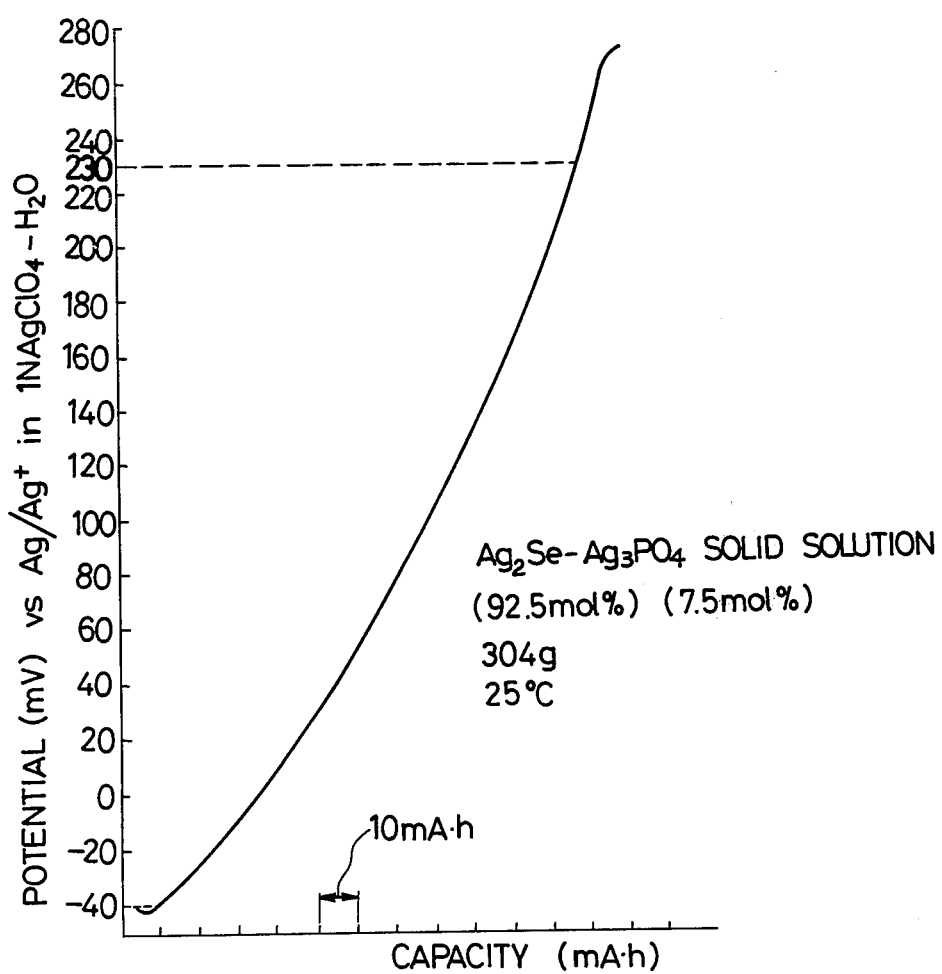
FIG. 2 is a graphical representation showing the relationship between the potential and the quantity of electricity (capacity) of an $Ag_2Se-Ag_3PO_4$ solid solution.

When a current is passed through this cell, silver in the $Ag_2Se-Ag_3PO_4$ solid solution dissolves or deposits depending on the quantity of electricity passed in accordance with Faraday's law, and the content of the silver in the $Ag_2Se-Ag_3PO_4$ solid solution changes. The relationship between the quantity of electricity and the potential of the $Ag_2Se-Ag_3PO_4$ solid solution at this time is shown in FIG. 2. The values shown in FIG. 2 were obtained through calculation by converting the values obtained with the cell shown in FIG. 1 to those which would be obtained if the positive electrode contained 1 mole (304 g) of the $Ag_2Se-Ag_3PO_4$ solid solution.

As shown in FIG. 2, when a current is passed in a direction which causes silver to dissolve from the $Ag_2Se-Ag_3PO_4$ solid solution, the potential of the $Ag_2Se-Ag_3PO_4$ solid solution as an electrode changes in a direction more positive with respect to the reference electrode (silver electrode). Conversely, when a current is passed in a direction which causes silver to deposit on the $Ag_2Se-Ag_3PO_4$ solid solution electrode, the potential of the $Ag_2Se-Ag_3PO_4$ electrode changes in a direction which is more negative with respect to the reference electrode (silver electrode). FIG. 2 also shows that the potential range where the relationship between the quantity of electricity passed and the potential is reproducible is a range within which the potential of the $Ag_2Se-Ag_3PO_4$ solid solution electrode is about −40 mV to +230 mV with respect to the reference electrode (silver electrode). Within this potential range, the quantity of electricity passed and the potential of the $Ag_2Se-Ag_3PO_4$ solid solution exhibit the relationship represented by the curve shown in FIG. 2.

The principle of operation of the electrochemical potential memory device of the invention is described in detail below.

Figure 3A:
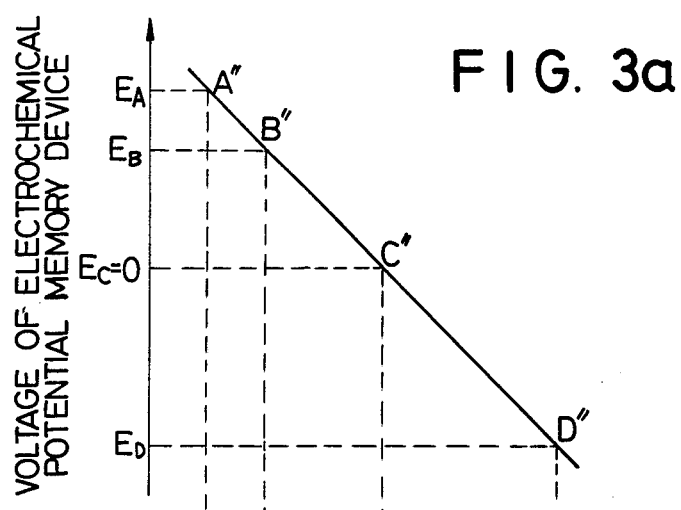
FIGS. 3a and 3b are graphical representations showing the theory of operation of the electrochemical potential memory device of this invention.

An electrochemical potential memory device of two electrodes containing an equal weight of an $Ag_2Se-Ag_3PO_4$ solid solution in each electrode and an electrolyte containing $Ag^+$ ion is used for the purposes of explanation. One of the two electrodes is designated an α-electrode, and the other of the two electrodes is designated a β-electrode and the α and β being interchangeable with each other. The voltage of the device is measured between the α-electrode and the β-electrode, as shown in FIG. 3a. The single electrode potentials of the α-electrode and the β-electrode with respect to the silver electrode are also determined, and shown in FIG. 3b.

Figure 3B:
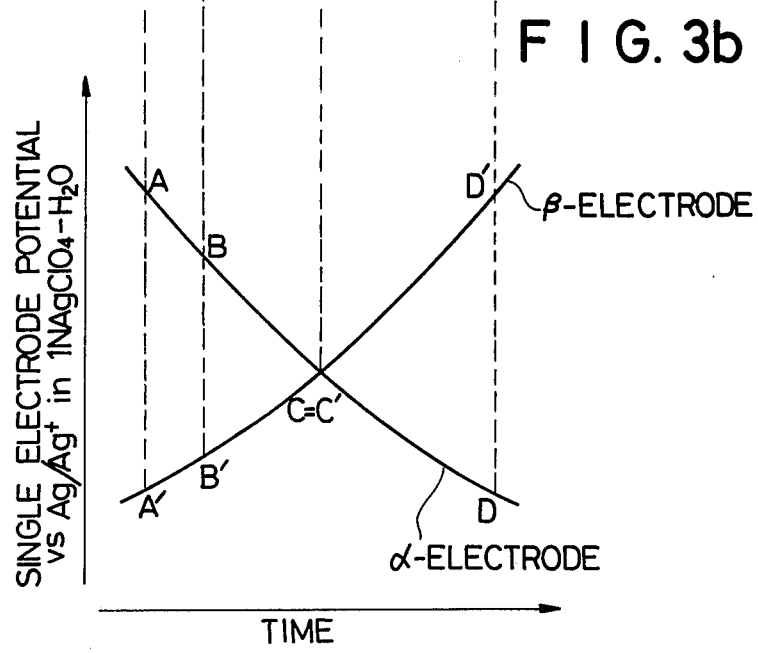

Assuming that the potential of the α-electrode is A and that of the β-electrode is A', the voltage of the electrochemical potential memory device, i.e., the potential between the α-electrode and the β-electrode, becomes $E_A$ which corresponds to AA'. If a current is passed in a direction which causes Ag to dissolve from the β-electrode and Ag to deposit on the α-electrode, the potential of the α-electrode changes from A→B→C→D, and the potential of β-electrode changes from A'→B'→C'→D' (with the proviso that C=C'), as shown in FIG. 3b. In response to these changes, the voltage of the electro-chemical potential memory device changes from A"→B"→C"→D", as shown in FIG. 3a (with the proviso that the signs of $E_A$ and $E_B$ are plus, $E_A$ is larger than $E_B$, $E_C$ is 0 volt, and the sign of $E_D$ is minus). It is important with the voltage changes of electrochemical potential memory devices that with a single electrode of an $Ag_3Se-Ag_3PO_4$ solid solution, the relationship between the voltage and the quantity of electricity is represented by a curve as shown in FIG. 3b, whereas in an electrochemical potential memory device, the line connecting A" and D" is substantially linear as a result of the effects occurring at the α-electrode and the β-electrode negating each other.

Some Examples of the invention are given below in order to provide an even better understanding of the present invention.

EXAMPLE I

Examples of the electrochemical potential memory device of this invention are described below.

Figure 4:
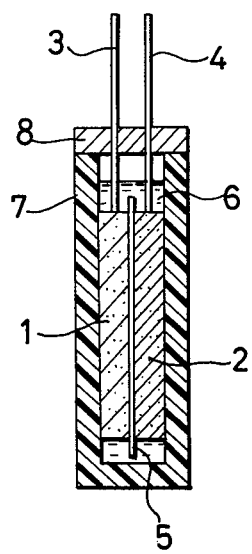
FIG. 4 is a sectional view of the electrochemical potential memory device of this invention.

FIG. 4 is a sectional view showing the structure of the electrochemical potential memory device of this invention. In this drawing, reference numerals 1 and 2 represent $Ag_2Se-Ag_3PO_4$ solid solutions of 92.5 mole% of $Ag_2Se$ and 7.5 mole% of $Ag_3PO_4$. The two electrodes are quite the same, and have a size of 10 mm×5 mm with a thickness of about 1 mm. The weight of the $Ag_2Se-Ag_3PO_4$ is 350 mg per electrode. Reference numerals 3 and 4 represent lead wires made of a gold wire having a diameter of 0.4 mm, and reference numeral 5 designates a separator of a polypropylene non-woven fabric having a thickness of 0.1 mm. The reference numeral 6 represents an electrolyte which is a 1 N aqueous solution of $AgClO_4$ in an amount of about 0.2 cc/cell. A container and a closure therefore are designated at 7 and 8, respectively, and are both made of an acrylic resin. The electrodes of the two $Ag_2Se-Ag_3PO_4$ solid solution electrodes are present at +60 mV with respect to the $Ag/Ag^+$ electrode in a 1 N aqueous solution of $AgClO_4$.

Figure 5:
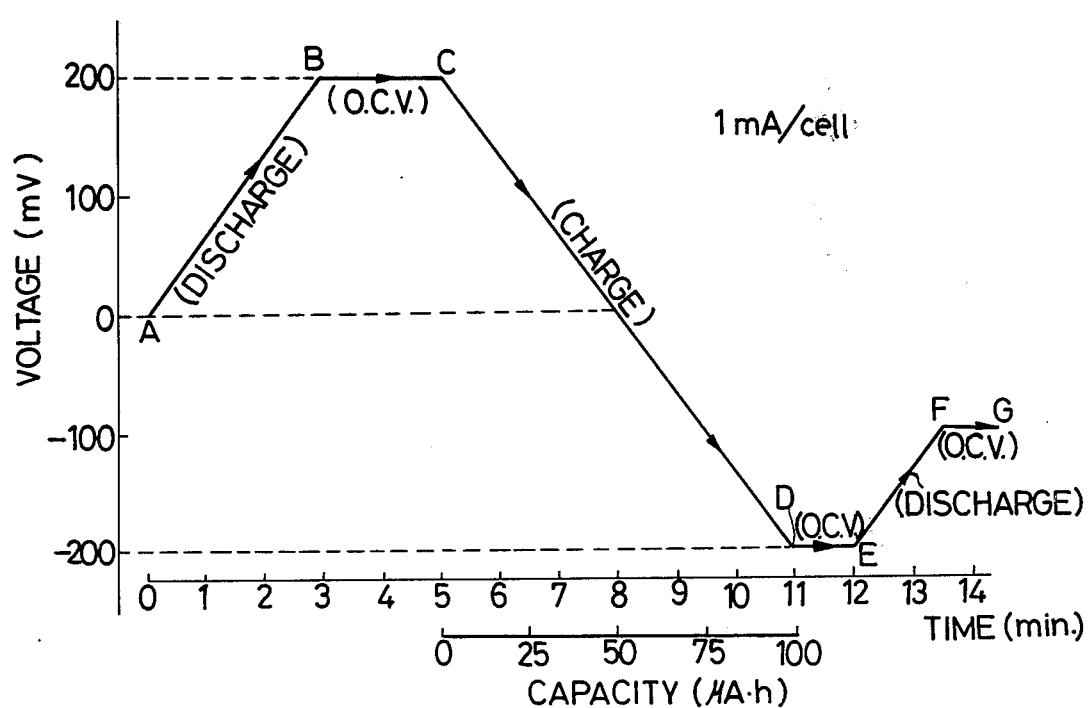
FIG. 5 is a graphical representation showing the characteristics of the electrochemical potential memory device of this invention when the device is subjected to charging and discharging at 1 mA/cell.

FIG. 5 shows the characteristics of the above-decribed electrochemical potential memory device when the device repeatedly is charged and discharged at 1 mA/cell. The voltage of the device was 0 mV at the outset, and this point is designated as A. When an electric current is passed in the direction of a higher voltage (passing of current in this direction is taken as "discharging"), the voltage changes from A to B. When the current is cut off at point B, the voltage is retained as B→C. Then, when the current is passed from point C in the opposite direction (passing of a current in this direction is taken as "charging"), the voltage decreases, and reaches −200 mV (point D) past 0 mV. When the current is cut off at point D, the open-circuit voltage is retained as D→E. If discharging is performed by again changing the direction of the current flow, the voltage increases from E to F. Within the range of +200 mV to −200 mV, the open-circuit voltage is retained as shown by F→G in FIG. 5 at whatever point the current is cut off.

Figure 6:
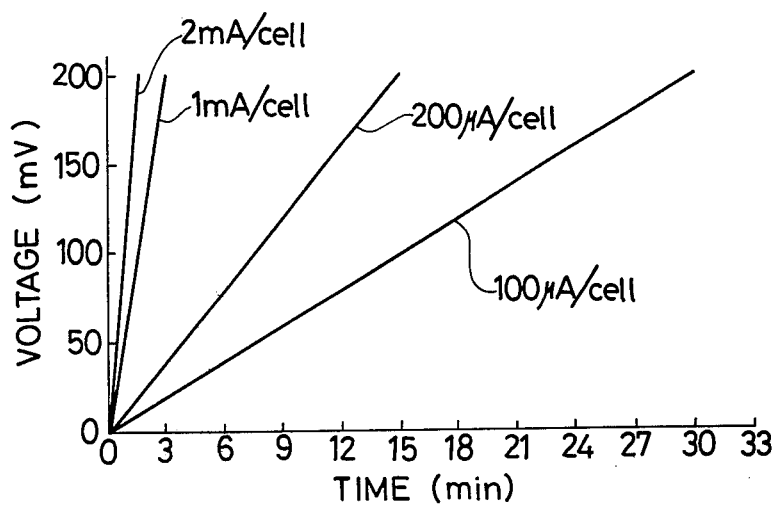
FIG. 6 is a graphical representation showing the characteristics of the electrochemical potential memory device of this invention when the device is actuated by a current of various magnitudes.

FIG. 6 shows the characteristics of the same electrochemical potential memory device when it is subjected to discharging from 0 mv to +200 mV at 2 mA/cell, 1 mA/cell, 200 μA/cell, and 100 μA/cell. The time required for the voltage to change from 0 mV to 200 mV is inversely proportional to the amount of the quantity of the current. This demonstrates that the quantity of electricity required for a voltage change of from 0 mV to 200 mV is constant at different current.

Figure 7:
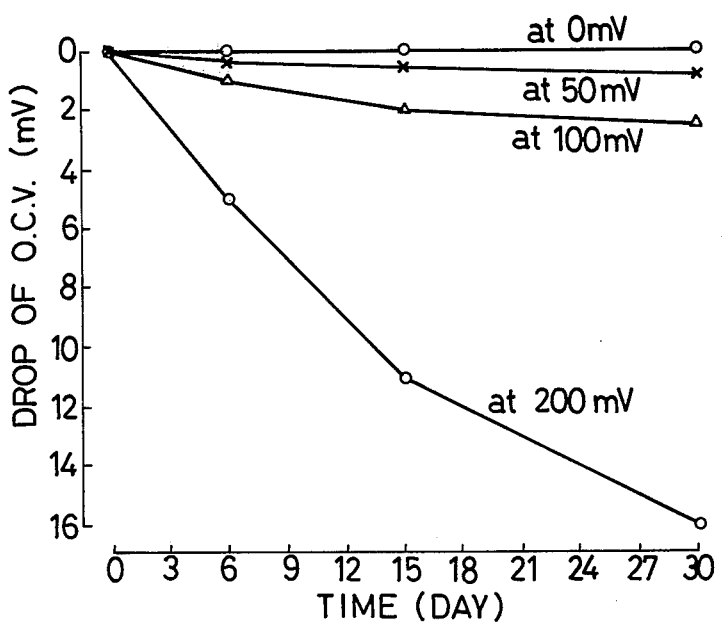
FIG. 7 is a graphical representation showing the voltage retention of the electrochemical potential memory device of this invention when the circuit of the device is open.

FIG. 7 shows the open-circuit voltage retention property of the same electrochemical potential memory device at 0 mV, 50 mV, 100 mV and 200 mV. At 0 mV, there is no change after a lapse of 30 days. After the lapse of the same period, there is a decrease of 0.8 mV at 50 mV; a decrease of 2.5 mV at 100 mV; and a decrease of 16.0 mV at 200 mV. The open-circuit voltage retention property decreases the higher the voltage is, but on the whole, the retention porperty is superior.

The same electrochemical potential memory device is repeatedly charged and discharged between 0 mV to +200 mV at 1 mA/cell. No change in characteristics nor in the appearance of the $Ag_2Se$-$Ag_3PO_4$ solid solution electrode is observed even if the charging and discharging are performed through more than 10,000 cycles. For this reason, the electrochemical potential memory device of this invention can be subjected to repeated charging and discharging almost endlessly.

EXAMPLE II

The electrochemical potential memory device in this Example is quite the same as that of Example I in regard to the materials used and the structure thereof, but the weights of the $Ag_2Se$-$Ag_3PO_4$ solid solution in the two electrodes differ from each other, the α-electrode containing 700 mg of the $Ag_2Se$-$Ag_3PO_4$ solid solution and the β-electrode containing 350 g of the $Ag_2Se$-$Ag_3PO_4$ solid solution. Both of these electrodes are set at a voltage of +60 mV with respect to the $Ag/Ag^+$ electrode in a 1 N aqueous solution of $AgClO_4$. The characteristics of this electrochemical device will be described with reference to FIG. 8.

Figure 8A:
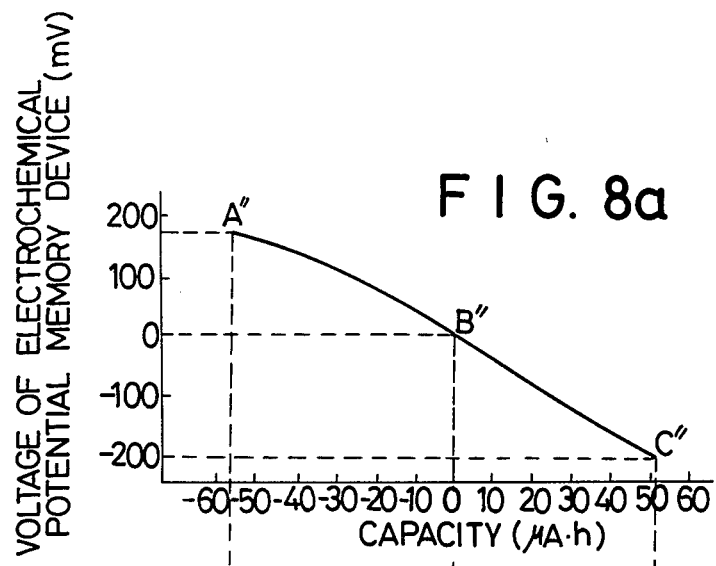
FIGS. 8a and 8b are graphical representations showing the theory of operation of an electrochemical device when the weights of the $Ag_2Se-Ag_3PO_4$ solid solution present in two electrodes are different from each other.
Figure 8B:
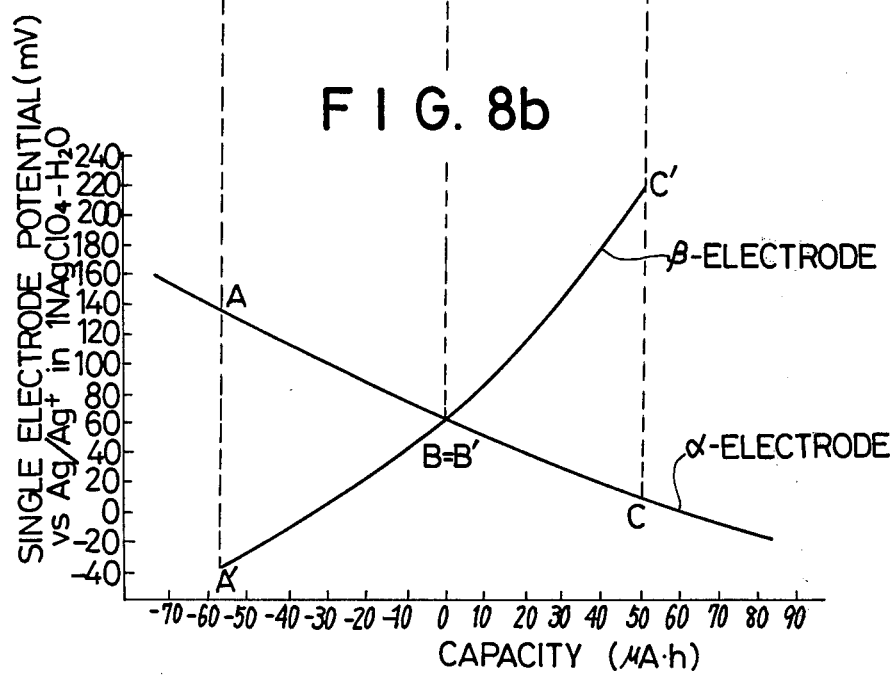

FIG. 8b shows the single electrode potentials of the two electordes. Initially, both the α-electrode and the β-electrode have a potential of B=B'. When a current is passed in a direction which causes a dissolving of silver from the α-electrode and a deposition of silver on the β-electrode to occur, the potential of the α-electrode changes from B to A, and the potential of the β-electrode changes from B'(=B) to A'. In response to these changes, the voltage of the electrochemical device changes from B" to A", as shown in FIG. 8a. When a current is passed in an opposite direction, the potential of the α-electrode changes from A→B→C, and the potential of the β-electrode changes from A'→B'(=B)→C'. In response to these changes, the terminal voltage of the electrochemical device changes from A"→B"→C".

However, since the weight of the $Ag_2Se$-$Ag_3PO_4$ solid solution in the α-electrode is twice as large as that in the β-electrode, the line connecting A"-B" and B"-C" is not straight lines, as shown in FIG. 8a and are not symmetrical to each other with respect to 0 mV. As a result, the line A"-B"-C" is curved line. Thus, when the weights of the $A_2Se$-$Ag_3PO_4$ in the two electrodes differ from each other, the relationship between the voltage of the electrochemical potential memory device and the quantity of electricity passed is not linear.

EXAMPLES III TO VIII

Electrochemical potential memory devices are constructed using the same materials and structures as set forth in Example I except that the composition of the $Ag_2Se$-$Ag_3PO_4$ solid solution is changed as shown in Table 1 below.

Table 1

| | composition of the Solid Solution | |
|---|---|---|
| Example | $Ag_2Se$ (mol %) | $Ag_3PO_4$ (mol %) |
| III | 95 | 5 |
| IV | 94 | 6 |
| V | 93 | 7 |
| VI | 92 | 8 |
| VII | 91 | 9 |
| VIII | 90 | 10 |

The characteristics of these electrochemical devices are the same as those of the device shown in Example I.

EXAMPLES IX TO XIV

Electrochemical potential memory devices are constructed using the same materials and structures as set forth in Example I except that the electrolyte is changed as shown in Table 2 below. When an organic electrolyte is used, the container c is changed to a polypropylene container.

Table 2

| Example | Electrolyte | |
|---|---|---|
| | Solute, concentration | Solvent, volume % |
| IX | 1N $AgNO_3$ | $H_2O$ |
| X | 0.5N $AgClO_4$+0.5N $AgNO_3$ | $H_2O$ |
| XI | 0.5N $AgClO_4$ | Propylene carbonate |
| XII | 1N $AgClO_4$ | Methyl formate |
| XIII | 1N $AgClO_4$ | 80% $H_2O$+20% Methanol |
| XIV | 0.5N $AgClO_4$ | 50% Propylene carbonate +50% Methyl formate |

The characteristics of these electrochemical potential memory devices are the same as those of the device shown in Example I. This means that any electrolyte which permits the passage of $Ag+$ ion can be used irrespective of the types of solvent and solute employed.

EXAMPLE XV TO XVIII

Electrochemical potential memory devices are constructed using the same materials and structures as set forth in Example I except that the materials used for the lead wires were changed as shown in Table 3 below.

Table 3

| Example | Lead wire Material | Standard Single Electrode Potential (V) | |
|---|---|---|---|
| XV | Ni | $Ni/Ni^{2+}$ | −0.25 |
| XVI | Cu | $Cu/Cu^+$ | 0.521 |
| — | Ag | $Ag/Ag^+$ | 0.799 |
| XVII | Pd | $Pd/Pd^{2+}$ | 0.987 |
| XVIII | Pt | $Pt/Pt^{2+}$ | 1.2 |
| I | Au | $Au/Au^{3+}$ | 1.50 |

The relationship between the voltage and the quantity of electricity passed in these electrochemical potential memory devices is substantially the same as that of the device shown in Example I. However, there is a large difference in the open-circuit voltage retention property.

The voltages of the electrochemical potential memory devices of Examples XV to XVIII and that of Example I are set at 100 mV, and the changes after 24 hours are compared. In Examples I, XVII and XVIII, the change of the open-circuit voltage is less than 0.1 mV, but the voltage decreases by 8.6 mV in Example XV and 6.1 mV in Example XVI.

This can be accounted for by the relationship of the material used for the lead wires to the standard single electrode potential of silver. As shown in Table 3, the standard single electrode potentials of Ni and Cu are more negative than that of Ag, and the standard single electrode potentials of Au, Pt and Pd are more positive than that of Ag. The open-circuit voltage retention of the electrochemical potential memory device is better when Au, Pt or Pd is used for the lead wires. In other words, when a material having a standard single electrode potential more positive than that of Ag is used as lead wires, the lead wires do not participate in an electrochemical reaction. However, when a material having a standard single electrode potential more negative than that of Ag is used, a localized cell with the Ag on the electrode is formed, thus causing a change in the potential of the electrode to occur.

The collector or terminals, etc. of the electrode does not need to be made completely of a single material, and if desired, such parts may be made of a material whose surface is coated with a material having a standard single electrode potential more positive than that of Ag.

EXAMPLE XIV

The electrochemical potential memory device of this Example is the same as the device set forth in Example I except for the initial voltage of the $Ag_2Se$-$Ag_3PO_4$ solid solution electrode. The initial potential of the solid solution electrode is set at $-20$ mV with respect to the Ag electrode. The characteristics of the electrochemical potential memory device of this Example will be described with reference to FIG. 9.

Figure 9A:
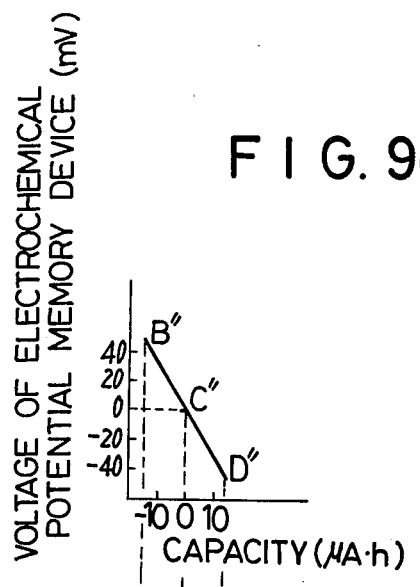
FIGS. 9a and 9b are graphical representations showing the theory of operation of an electrochemical device when the initial potential of the two electrodes is $-20$ mV with respect to a silver electrode.
Figure 9B:
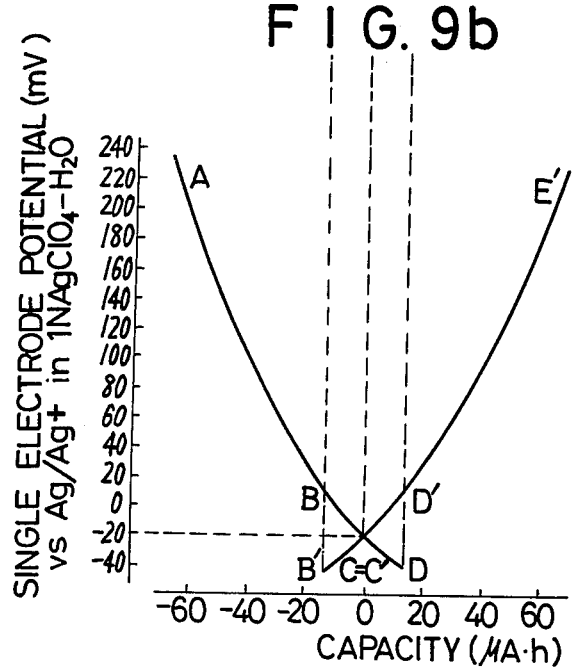

One of the solid solution electrodes is termed an $\alpha$-electorde, and the other of the solid solution electrodes is termed a $\beta$-electrode. The terminal voltage of the electrochemical device is measured between the $\alpha$-electrode and the $\beta$-electrode, and shown in FIG. 9a. The single electrode potentials of the $\alpha$-electrode and the $\beta$-electrode are shown in FIG. 9b. The initial potential of the $\alpha$-electrode and the $\beta$-electrode is $-20$ mV with respect to the $Ag/Ag^+$ electrode, as shown in FIG. 9b. If a current is passed in a direction which causes Ag to dissolve from the $\alpha$-electrode and Ag to deposit on the $\beta$-electrode, the potential of the $\alpha$-electrode changes from C→B→A, whereas the potential of the $\beta$-electrode changes from C′(=C) to B′ and shows no reproducibility when the potential is lower than B′. In other words, no potential change of the $\beta$-electrode corresponding to the change B→A of the $\alpha$-electrode exists. Likewise, the potential change of the $\alpha$-electrode corresponding to the change C′(=C)→E′→D′ of the $\beta$-electrode is only C→D. For this reason, as shown in FIG. 9a, the operable voltage range of the electrochemical device is only within about $+40$ mV to about $-40$ mV over B″-C″-D″, and such is far narrower than the voltage range of the device set forth in Example I.

Likewise, when the initial potentials of the two $Ag_2Se$-$Ag_3PO_4$ solid solution electrodes are changed with respect to the $Ag/Ag^+$ electrode, the operable voltage range of the electrochemical device is determined in accordance therewith. Since the capacity of the electrochemical device is substantially proportional to the operable voltage range of the electrochemical device, the capacity of the device also becomes a function of the initial potential of the $Ag_2Se$-$Ag_3PO_4$ solid solution electrode.

Figure 10:
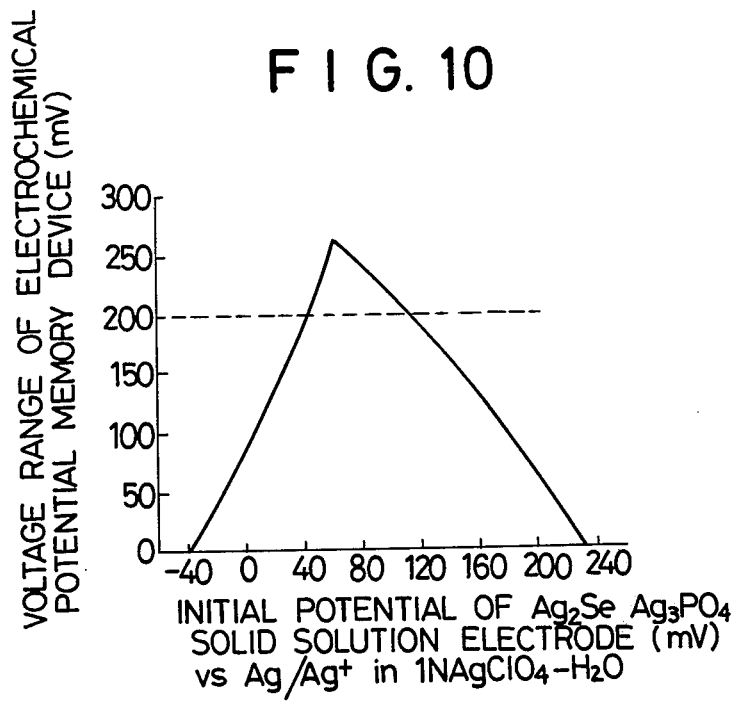
FIG. 10 is a graphical representation showing the relationship between the initial potential of an $Ag_2Se-Ag_3PO_4$ solid solution electrode and the operable voltage range of an electrochemical potential memory device.

FIG. 10 shows the relationship of the operable voltage range (absolute value) and the initial potential of the $Ag_2Se$-$Ag_3PO_4$ solid solution electrode in the electrochemical potential memory device. It can be seen from FIG. 10 that the operable voltage range is $+266$ mV to $-266$ mV when the initial potential of the $Ag_2Se$-$Ag_3PO_4$ is $+60$ mV with respect to the $Ag/Ag^+$ electrode, and becomes narrower whether the potential changes in a higher or lower direction. The voltage of the electrochemical device becomes zero when the initial potential is $-40$ mV and $+230$ mV. As can also be seen from FIG. 10, in order to adjust the operable voltage range of the electrochemical potential memory device to a range of $+200$ mV to $-200$ mV, the initial potential of the $Ag_2Se$-$Ag_3PO_4$ solid solution electrode needs to be adjusted to $+40$ mV to $+110$ mV in a 1 N aqueous solution of $AgClO_4$ with respect to the $Ag/Ag^+$ electrode.

EXAMPLE XX

The electrochemical potential memory device of this Example is the same as that of Example I except that the size of each of the two $Ag_2Se$-$Ag_3PO_4$ solid solution electrodes is changed to 10 mm×5 mm with a thickness of about 2 mm, and the weight of the $Ag_2Se$-$Ag_3PO_4$ in each electrode was changed to 700 mg. The characteristics of this electrochemical device in charging and discharging at 1 mA/cell as shown in FIG. 11.

Figure 11:
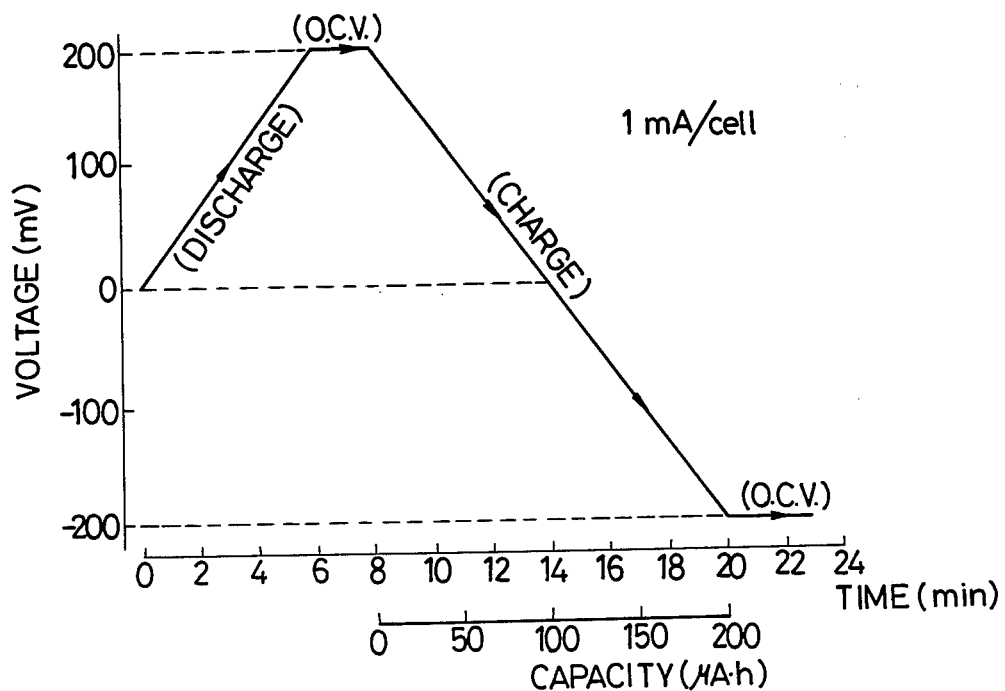
FIG. 11 is a graphical representation showing the characteristics of the electrochemical potential memory device shown in Example XX hereinafter.

A comparison of FIG. 11 with FIG. 5 shows that within the same voltage range, the capacity of the device of Exmaple XX is twice that of the device of Example I. In other words, this means that the capacity of an electrochemical potential memory device is proportional to the weight of the $Ag_2Se$-$Ag_3PO_4$ solid solution in the electrode.

The shape of the electrode is a flat plate in Example I, for instance. However, since the characteristics of an electrochemical potential memory device depend upon the weight of the $Ag_2Se$-$Ag_3PO_4$ solid solution in the electrode, other shapes, such as a coiled shape or a cylindrical shape, can also be used.

As is clear from the Examples given above, the electrochemical potential memory device in accordance with this invention exhibits excellent characteristics, some of which are set forth below (1) The device of the invention is convenient to use, and the circuit to be attached thereto, for example, can be simplified, because unlike conventional electrochemical potential memory devices, two electrodes are used, and the same electrode is used to pass a current and to measure the potential.

(2) The relationship between the quantity of electricity passed and the potential is substantially linear. This relationship is non-linear when only one $Ag_2Se$-$Ag_3PO_4$ solid solution electrode is used. In the electrochemical devices of this invention, the effects of the two electrodes negate each other when the weights of the $Ag_2Se-Ag_3PO_4$ solid solution in each of the two electrodes is equal to each other.

(3) The operable voltage range of the electrochemical device of the invention can be adjusted to a range of +200 mV to −200 mV or even to a broader range by setting the initial potential of the $Ag_2Se-Ag_3PO_4$ electrode within the range of +40 mV to +110 mV with respect to the $Ag/Ag^+$ electrode in a 1 N aqueous solution of $AgClO_4$.

(4) Since polarization between the $Ag_2Se-Ag_3PO_4$ solid solution electrodes and the electrolyte is small, the passage of a current and the measurement of potentials can be performed between the same electrodes. When the current density is as high as several tens of $mA/cm^2$, errors may occur due to the effect of polarization or due to the effect of the resistance of the electrolyte. However, when the device is used at a current of less than several $mA/cm^2$, such effects can be neglected.

(5) No dendrite occurs when Ag comes into the $Ag_2Se-Ag_3PO_4$ solid solution electrodes or goes out of the $Ag_2Se-Ag_3PO_4$ solid solution. This is because the diffusion of Ag in the $Ag_2Se-Ag_3PO_4$ is fast, and Ag migrates into the interior of the electrode simultaneously with electrodeposition and uniformity is maintained. For this reason, there is no change in the shape of the electrodes when charging and discharging are repeated any number of times. Thus, charging and discharging can be performed almost endlessly.

(6) The device of this invention has a good potential retention property when no current is passed therethrough. This is because the potential of the $Ag_2Se-Ag_3PO_4$ solid solution is determined only by the amount of Ag present in this solid solution, and does not change at all unless there is a difficulty such as short-circuiting.

(7) Any aqueous or non-aqueous solution containing an $Ag^+$ ion or a mixture of such solutions can be used as the electrolyte. Thus, the operable temperature range can be broadened by choosing the electrolyte according to the desired use.

(8) Since the capacity of the electrochemical potential memory device is proportional to the weight of the $Ag_2Se-Ag_3PO_4$ solid solution in the electrodes, the electrochemical device can be built in various capacities ranging from high to low capacities.

(9) The voltage of the electrochemical device of this invention is as low as +200 mV to −200 mV, and therefore, no difficulties such as the evolution of gas due to a decomposition of the electrolyte occur. Hence, the device can be built in a completely sealed structure.

While the invention has been described in detail and with reference to specific embodiments thereof, it will be apparent to one skilled in the art that various changes and modifications can be made therein without departing from the spirit and scope thereof.

What is claimed is:

1. An electrochemical potential memory device comprising (a) an electrolyte containing $Ag^+$ ion and (b) two electrodes spaced apart and disposed within said electrolyte and containing an $Ag_2Se-Ag_3PO_4$ solid solution.

2. The device of claim 1, wherein the weight of the $Ag_2Se-Ag_3PO_4$ solid solution present in one of the two electrodes is equal to that in the other of the two electrodes.

3. The device of claim 1, wherein the $Ag_2Se-Ag_3PO_4$ solid solution contains 5 to 10 mole% of $Ag_3PO_4$.

4. The device of claim 1, wherein that part of each electrode which is other than the $Ag_2Se-Ag_3PO_4$ solid solution is a material having a standard single electrode potential more positive than that of Ag, or a material whose surface is coated with a material having a standard single electrode potential more positive than that of Ag.

5. The device of claim 4 wherein said material having a standard single electrode potential more positive than that of Ag is gold.

6. The device of claim 4, wherein said material having a standard single electrode potential more positive than that of Ag is platinum.

7. The device of claim 4, wherein said material having a standard single electrode potential more positive than that of Ag is palladium.

8. The device of claim 1, wherein the electrolyte is an aqueous solution of silver perchlorate.

9. The device of claim 1, wherein the electrolyte is an aqueous solution of silver nitrate.

10. The device of claim 1, wherein the electrolyte is a non-aqueous solution of silver perchlorate.

11. The device of claim 1, wherein the electrolyte is a non-aqueous solution of silver nitrate.

12. The device of claim 1, wherein the electrolyte is a mixture of water containing $Ag^+$ ion and a non-aqueous solvent.

13. The device of claim 1, wherein the $Ag_2Se-Ag_3PO_4$ solid solution electrodes have an initial potential of +40 mV to +110 mV with respect to a $Ag/Ag^+$ electrode in a 1 N aqueous solution of silver perchlorate.

14. The device of claim 1, wherein said electrolyte is aqueous.

15. The device of claim 1, wherein said electrolyte is non-aqueous.

16. An electrochemical potential memory device comprising (a) an electrolyte comprising an aqueous solution of silver perchlorate, and (b) two electrodes spaced apart and disposed within said electrolyte in which each of the two electrodes contains a solid solution of 92.5 mole percent $Ag_2Se$ and 7.5 mole percent $Ag_3PO_4$ and in which the amount of said solid solution in one of the two electrodes is the same as that in the other of the two electrodes, in which said electrodes include lead wires of gold connected thereto and have an initial potential of +60 mV with respect to a $Ag/Ag^+$ electrode in a 1 N aqueous solution of silver perchlorate.

* * * * *